US011629286B2

(12) United States Patent
Martinsen et al.

(10) Patent No.: US 11,629,286 B2
(45) Date of Patent: Apr. 18, 2023

(54) FABRICATION OF PHOTOCHROMIC DEVICE

(71) Applicant: Institutt for Energiteknikk, Kjeller (NO)

(72) Inventors: Fredrik Aleksander Martinsen, Oslo (NO); José Montero Amenedo, La Bañeza (ES); Smagul Karazhanov, Oslo (NO); Erik Stensrud Marstein, Skedsmokorset (NO)

(73) Assignee: Institutt for Energiteknikk, Kjeller (NO)

( * ) Notice: Subject to any disclaimer, the term of this patent is extended or adjusted under 35 U.S.C. 154(b) by 777 days.

(21) Appl. No.: 16/323,091

(22) PCT Filed: Jun. 15, 2017

(86) PCT No.: PCT/EP2017/064680
§ 371 (c)(1),
(2) Date: Feb. 4, 2019

(87) PCT Pub. No.: WO2018/024394
PCT Pub. Date: Feb. 8, 2018

(65) Prior Publication Data
US 2019/0169493 A1    Jun. 6, 2019

(30) Foreign Application Priority Data

Aug. 5, 2016  (NO) .................................... 20161267

(51) Int. Cl.
*C09K 9/00* (2006.01)
*G02B 5/23* (2006.01)
(Continued)

(52) U.S. Cl.
CPC .............. *C09K 9/00* (2013.01); *C01F 17/218* (2020.01); *C03C 17/22* (2013.01); *C03C 17/27* (2013.01);
(Continued)

(58) Field of Classification Search
CPC ......... C09K 9/00; C01F 17/218; C03C 17/22; C03C 17/27; C03C 2217/425;
(Continued)

(56) References Cited

U.S. PATENT DOCUMENTS 5,976,717 A    11/1999  Holdik et al.
6,175,450 B1    1/2001  Andreani et al.
(Continued)

FOREIGN PATENT DOCUMENTS

JP    S58034437 A    2/1983
JP    H10-503858 A    4/1998
(Continued)

OTHER PUBLICATIONS

Chang Chuan You, Dynamic reactive sputtering of photochromic yttrium hydride thin films, 2015, Solar Energy Materials and Solar Cells, vol. 143, p. 623-626 (Year: 2015).*
(Continued)

*Primary Examiner* — Jennifer Wecker
*Assistant Examiner* — Patrick S Ott
(74) *Attorney, Agent, or Firm* — Shackelford, Bowen, McKinley & Norton, LLP

(57) ABSTRACT

Method for producing a photochromic material and a component including the photochromic material, where the method comprises the steps of:-first the formation on a substrate of a layer of an essentially oxygen free metal hydride with a predetermined thickness using a physical vapor deposition process; and -second exposing the metal hydride layer to oxygen where the oxygen reacts with the
(Continued)

metal hydride, resulting in a material with photochromic properties.

9 Claims, 3 Drawing Sheets

(51) Int. Cl.

| | |
|---|---|
| C03C 17/22 | (2006.01) |
| C23C 14/58 | (2006.01) |
| C08J 7/048 | (2020.01) |
| C01F 17/218 | (2020.01) |
| C03C 17/27 | (2006.01) |
| C08J 7/06 | (2006.01) |
| C23C 14/00 | (2006.01) |
| C23C 14/06 | (2006.01) |
| C08J 7/043 | (2020.01) |
| C23C 14/02 | (2006.01) |
| C23C 14/08 | (2006.01) |
| C08J 7/046 | (2020.01) |

(52) U.S. Cl.
CPC .............. *C08J 7/043* (2020.01); *C08J 7/046* (2020.01); *C08J 7/048* (2020.01); *C08J 7/06* (2013.01); *C23C 14/0057* (2013.01); *C23C 14/024* (2013.01); *C23C 14/06* (2013.01); *C23C 14/08* (2013.01); *C23C 14/58* (2013.01); *C23C 14/5853* (2013.01); *G02B 5/23* (2013.01); *C01P 2006/60* (2013.01); *C03C 2217/425* (2013.01); *C03C 2218/151* (2013.01); *C03C 2218/155* (2013.01); *C03C 2218/322* (2013.01)

(58) Field of Classification Search
CPC ........ C03C 2218/151; C03C 2218/155; C03C 2218/322; C08J 7/043; C08J 7/046; C08J 7/048; C08J 7/06; C23C 14/0057; C23C 14/024; C23C 14/06; C23C 14/08; C23C 14/58; C23C 14/5853; G02B 5/23; C01P 2006/60
See application file for complete search history.

(56) References Cited

U.S. PATENT DOCUMENTS

| | | | |
|---|---|---|---|
| 6,586,102 | B1 | 7/2003 | Stachowiak |
| 9,099,673 | B2 | 8/2015 | Tchakarov et al. |
| 9,864,118 | B2 | 1/2018 | Soon et al. |
| 2005/0206990 | A1 | 9/2005 | Yoshimura et al. |
| 2006/0105134 | A1* | 5/2006 | LeBlanc, III ...... G11B 20/0084 428/64.4 |
| 2011/0048970 | A1* | 3/2011 | Sugaya ................ G01N 27/419 205/781 |
| 2016/0202402 | A1 | 7/2016 | Soon et al. |
| 2019/0002340 | A1 | 1/2019 | Martinsen et al. |

FOREIGN PATENT DOCUMENTS

| | | |
|---|---|---|
| JP | 2004-279680 A | 10/2004 |
| JP | 2013-109254 A | 6/2013 |
| JP | 2013-205559 A | 10/2013 |
| JP | 2018533776 A | 12/2018 |
| RU | 101971 U1 | 2/2011 |
| WO | WO-9841901 A1 | 9/1998 |
| WO | WO-2016109651 A1 | 7/2016 |
| WO | WO-2017125573 A1 | 7/2017 |

OTHER PUBLICATIONS

Mongstad et al., Transparent yttrium hydride thin films prepared by reactive sputtering, 2011, Journal of Alloys and Compounds, 509S, S812-S816 (Year: 2011).*
Chang et al., Dynamic reactive sputtering of photochromic yttrium hydride thin films, 2014, Solar Energy Materials & Solar Cells, 143, 623-626 (Year: 2014).*
Mongstad, Trygve Tveiteras., Thin-film metal hydrides for solar energy applications, 2012, University of Oslo, all pages (Year: 2012).*
Van der Molen et al., Insulating fcc YH3 stabilized by MgH2, 2001, Physical Review B, 63, 1-8 (Year: 2001).*
Jan Petter Maehlen, et al., Engineering of the band gap and optical properties of thin films of yttrium hydride, 2014, Appl. Phys. Lett. , 105, 031910 (Year: 2014).*
Deckwerth, Martin, "International Search Report," prepared for PCT/EP2017/051228, dated Mar. 28, 2017, four pages.
Van Gogh, A.T.M., et al., "Structural, Electrical, and Optical Properties of $La_{1-z} Y_z H_x$ Switchable Mirrors," Physical Review B, vol. 63, 2001, pp. 195105-1-195105-21.
Serra, E., et al., "Hydrogen Permeation Measurements on Alumina," Journal of the American Ceramic Society, vol. 88, Issue 1, 2005, pp. 15-18.
Baldé, Kaisa, "International Search Report," prepared for PCT/EP2017/064680, dated Oct. 6, 2017, four pages.
You, Chang Chuan, et al., "Dynamic Reactive Sputtering of Photochromic Yttrium Hydride Thin Films," Solar Energy Materials and Solar Cells, vol. 143, Sep. 23, 2014, pp. 623-626.
Mongstad, Trygve, et al., "Surface Oxide on Thin Films of Yttrium Hydride Studied by Neutron Reflectometry," Applied Physics Letters, vol. 100, 191604, May 10, 2012, pp. 191604-1 to 191604-3.
Huiberts, J. N., et al., "Yttrium and Lanthanum Hydride Films with Switchable Optical Properties," Nature, vol. 380, Mar. 21, 1996, pp. 231-234.
Mongstad, Trygve, et al., "A New Thin Film Photochromic Material: Oxygen-Containing Yttrium Hydride," Solar Energy Materials and Solar Cells, vol. 95, Sep. 16, 2011, pp. 3596-3599.
You, Chang Chuan, et al., "Engineering of the Band Gap and Optical Properties of Thin Films of Yttrium Hydride," Applied Physics Letters, vol. 105, 2014, pp. 031910-1 to 031910-4.
Mongstad, T., et al., "Transparent Yttrium Hydride Thin Films Prepared by Reactive Sputtering," Journal of Alloys and Compounds, 509S (2011), pp. S812-S816.
Pishtshev, Aleksandr, et al., "Role of Oxygen in Materials Properties of Yttrium Hydride," Solid State Communications, 194 (2014), pp. 39-42.
Mongstad, T., et al.; "The electronic state of thin films of yttrium, yttrium hydrides and yttrium oxide"; Solar Energy Materials & Solar Cells; 2014; 5 pages; http://dx.doi.org/10.1016/j.solmat.2014.05.037.

* cited by examiner

FABRICATION OF PHOTOCHROMIC DEVICE

The present invention relates to a fabrication method for a photochromic device, especially a photochromic transparent device like a window.

Due to improved building techniques and the utilization of modern methods for the fabrication of glass, large windows are an increasingly common sight in modern architecture. Although the incorporation of large-area windows often results in esthetic facades and excellent indoor lighting conditions, it can also represent a challenge in terms of energy efficiency and energy savings. Windows are, from an insulating point of view, the weakest point in a building, mainly because of their poor thermal insulation properties, but also because they allow for a significant unwanted indoors-outdoors radiative heat exchange.

The problem with unwanted radiative heat transfer through a window has been partly solved today through the use of solar control and low-e coatings, which are designed to reflect or transmit various parts of the light spectrum depending on the exact requirements. For example, solar control coatings are useful in warm climates, because they reflect the infrared component of the solar radiation, minimizing the thermal load of the building while transmitting the visible radiation. These coatings, however, are static, i.e. they do not adapt to the changing climate conditions; therefore, during clear sunny days they may admit an excess of visible solar radiation responsible of thermal and visual discomfort for the building's users.

Today, as a means of limiting the excess of visible light inlet, it is common to install permanently darkened windows or outdoor blinds. Both of these are excellent in controlling the effective transmittance through the windows but come with significant drawbacks. Permanently darkened windows for example block the light out also on non-sunny days, causing a permanent dim indoor environment. On the other hand, outdoor blinds are expensive, not very esthetic, they don't allow visual contact with the ambience, their installation is not always feasible, and they require regular expensive, time-consuming maintenance. Armed with the property of having dynamic optical transmissivity, and thus able to adapt to the climatic demands, smart windows offer an attractive alternative to outdoor blinds and permanently darkened windows.

In recent years, smart windows have advanced from being practically unknown to the general public to becoming the prime candidate for the next generation of windows. This is mainly because of the maturation of electrochromic products that are increasingly appearing in a wide range of applications, but also because we have started paying more attention to the $CO_2$ emissions caused by buildings. The latter has caused the advent of many recent energy regulations for buildings (NZE, nZEB, etc.), forcing entrepreneurs to come up with more energy saving measures in their technical building designs.

Smart windows can be based on chromogenic materials, i.e. materials that change their optical properties when exposed to an external stimulus, for example an electric field (electrochromic materials), temperature (thermochromic materials) or electromagnetic radiation (photochromic materials).

Although electrochromic windows offer the significant benefit of allowing the user to regulate their transparency by operating a switch, they suffer from a high price tag caused by a complex fabrication process and a high cost related to installation and maintenance. This high price tag largely hinders the extensive use of electrochromic windows as fenestration, and is an important motivation for the use and implementation of other available technologies (for example thermochromic and photochromic technologies).

Photochromic windows offer a simplified solution to the problem of glare and unwanted heating due to direct illumination. Instead of consisting of a complex structure that requires electricity to operate, photochromic windows can be made from a comparatively simple structure and need only light to function. Upon illumination with sunlight, a photochromic material will alter its transmission properties, a state that will reverse when the illumination is removed. A photochromic window that is transparent in the non-illuminated state but dim under illumination will therefore be ideal for use in buildings.

Photochromic materials have been around for decades, but then mainly in the form of organic compounds like fulgides, nitrones, stilbens and spiropyrans. Organic photochromic materials are used today for example in commercially available switchable sunglasses, in dyes and in paint amongst others.

Organic photochromic materials have been extensively studied and are used in a wide variety of commercially available products. However, these organic compounds lose their photochromic properties due to denaturation caused by repeated cycling between their clear and photodarkened state. This lack of durability makes organic photochromic materials unsuitable for any application in which a long life time is expected, such as a window. The high cost of synthesizing large quantities of organic photochromic materials is another drawback for its use in fenestration.

Inorganic photochromic materials can serve as an alternative to their organic counterparts as they will not suffer from denaturation and because they can be fabricated using scalable methods. Examples of inorganic photochromic materials are titanium oxide, tungsten oxide, barium-magnesium-silicon-oxide, yttrium hydride and oxygen-containing yttrium hydride.

Previous studies have reported on the fabrication of photochromic oxygen-containing yttrium hydride using reactive sputter deposition, where metallic yttrium was sputtered in a hydrogen and oxygen containing environment. This is discussed in the articles by Trygve Mongstad et al.: "A new thin film photochromic material: Oxygen-containing yttrium hydride", Solar Energy Materials & Solar Cells 95 (2011) 3596-3599, and by Chang Chuan You et al.: "Engineering of the band gap and optical properties of thin films of yttrium hydride", Applied Physics Letters 105, 031910 (2014). Although the fabrication method proved scalable and capable of yielding a material that could darken ~10% upon standard illumination, it allowed for limited compositional control and low reproducibility. It is an object of the present invention to provide an improved fabrication method for photochromic materials without these disadvantages. Photochromic materials based on yttrium have earlier been suggested for large scale use, including multi-stack films solar films such as those described in US2016/0202402.

The current invention relates to the field of thin film fabrication, especially for the fabrication of metal hydride-based photochromic thin films, which have the property of being able to alter their transparency reversibly upon illumination. The method can in particular be used to controllably produce large areas of highly photochromic oxygen-containing metal hydrides, where the processing parameters involved can be adjusted in order to tailor the properties of the material. The objects of the present invention are obtained as explained in the accompanying claims.

The fabrication method according to the invention involves an initial reactive sputter deposition of a binary metal hydride thin film based on a rare earth, lanthanide or alkaline metal—potentially doped by one or more other elements from the same groups—followed by a subsequent treatment with oxygen that aims to generate or improve any photochromic properties within the material. The post-fabrication treatment of the metal hydride with oxygen allows for a reaction between the metal hydride and the oxygen, resulting in the formation of any mix of oxides, oxyhydrides, and/or hydroxides that gives rise to the generation or improvement of the photochromic properties within the combined material. The doping of the initial metal hydride can be performed in order to alter the band structure and/or the absorptive properties of the final material.

The invention will be described more in detail with reference to the accompanying drawings, illustrating the invention by way of examples.

Figure 1:
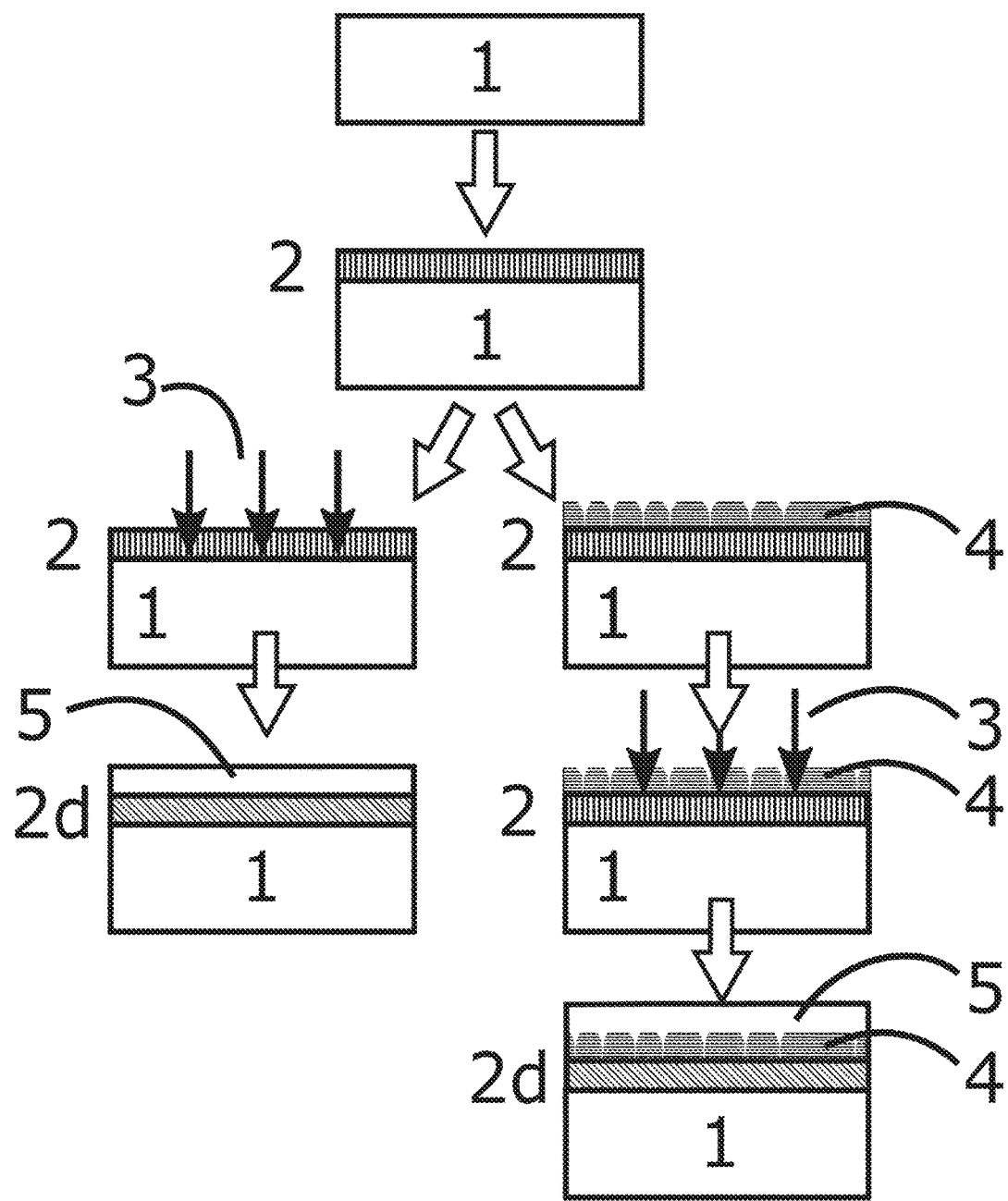
FIG. 1 illustrates two versions of the method according to the invention.

As can be seen in FIG. 1, the process according to the present invention starts with the deposition of an essentially oxygen-free metal hydride 2 onto a substrate 1 (e.g. glass or a polymer-based substrate). The metal hydride may comprise a metal from the groups of rare earth elements, lanthanides or alkalis, but according to the preferred embodiment of the invention the metal is yttrium, forming yttrium hydride. In the case where the metal hydride 2 is yttrium hydride, the inventors have used x-ray diffraction to show that this metal hydride has the same crystal structure as yttrium-di-hydride ($YH_2$). The crystal structure is face centered cubic and has a lattice constant matching the one reported for $YH_2$, i.e. 0.521 nm. The optical appearance also corresponds to earlier experiences with the same material. The final photochromic material is achieved by exposing this metallic hydride to oxygen as described below.

For the particular case where the as-deposited metal hydride is yttrium hydride, the resulting photochromic material after exposure to oxygen consists of at least one phase possessing the fcc crystal structure with a $Fm\bar{3}m$ symmetry. This phase is comprised of at least yttrium and oxygen, where yttrium mainly occupies the main lattice sites while oxygen occupies the tetrahedral lattice sites with occupancy of approximately 50%. More exactly, this occupancy can measure 44% resulting in an oxygen to yttrium-ratio in this phase of 0.88.

In the simple first embodiment of the invention (FIG. 1, left), the as-deposited metal hydride 2 is exposed to oxygen 3, reacting subsequently with it, leading to the formation of the photochromic material 2d. In the second embodiment (FIG. 1, right) a protective 4 oxygen-permeable capping layer 4 is deposited on top of the metal hydride layer. The permeability to oxygen of the protective layer 4 may originate from the intrinsic properties of the material or by film discontinuities or faults such as scratches, openings etc. In any case, this capping layer 4 allows the oxygen to reach the metal hydride layer 2 leading to the formation of the photochromic material 2d. The way this takes place is schematically explained in FIG. 3. In the last step a protective anti-scratch layer 5 is deposited on top. This layer can be also intended to limit the diffusion of oxygen, hydrogen or other elements to the underlying layer.

The final oxygen content of the active photochromic film can be pre-defined by controlling properties like porosity and microstructure, thickness and other features of the as-deposited metal hydride. These properties, as described below, can be achieved by tuning the deposition parameters, such as substrate temperature, substrate type, chamber pressure, sputtering power, deposition time, deposition gas flow, etc.

The porosity and microstructure (being the arrangement and size of grains, agglomerates of grains, and micro cracks) of the as-deposited metal hydride is highly important in determining the subsequent degree of post-deposition oxidation of the metal hydride film. In a porous material—defined as a material that is not continuous, but which contains pores, voids and cavities—the diffusion of oxygen will take place mainly through these pores and cavities, which allow for a much higher fraction of the total material to be directly exposed to oxygen.

In the particular case of reactive sputter deposited metal hydrides, the porosity and microstructure can be largely controlled by the amount of hydrogen introduced into the deposition chamber during fabrication of the metal hydride; the higher the hydrogen content the more porous the film. Therefore, after the subsequent treatment with oxygen, the incorporation of oxygen will then be directly related to the amount of hydrogen introduced into the deposition chamber during the fabrication. Other ways of obtaining films of different porosity and microstructure are, for example, through increasing the pressure of non-reactive gasses, adjusting the sputter power during deposition or by adjusting the film thickness.

In the process consisting of treating the metal hydride with oxygen, the oxygen will react with the material, immediately causing an oxide layer to form on the exposed material surface (both the top surface and inside any pores and cavities). Upon prolonged times, the oxygen will penetrate down into the interior of the material, mainly along grain boundaries and boundaries between agglomerates of densely packed grains. A local equilibrium in the oxidation process will be reached when the oxidation reaction has caused the formation of oxygen-rich phases thick enough to impose an impenetrable barrier for further diffusion of oxygen. In thin films the speed and extent of the oxidation process will strongly be affected by the coarseness of the microstructure, as a finer microstructure will result in a larger availability of possible diffusion paths for the oxygen as well as a larger area available for oxidation.

The incorporation of oxygen throughout the entire film is critical for obtaining the right chemical composition and hence the desired properties in the final material. Earlier work has reported on a reaction between metal hydride-based thin films and oxygen (Trygve Mongstad et al.: "Transparent yttrium hydride thin films prepared by reactive sputtering" in Journal of Alloys and Compounds 509 (2011) 812-816), but where the oxygen only reacted with the surface of the thin film. This resulted in the formation of a metal oxide localized solely on this surface, giving no detectable changes in the photochromic properties of the combined material. This surface oxide formation was later reported in the publication by Trygve Mongstad et al.: "Surface oxide on thin films of yttrium hydride studied by neutron reflectometry" in Applied Physics Letters 100 (2012) 191604. Here it was measured to be only be 5-10 nm thick and the photochromic properties observed in the material involved in that study have been accredited oxygen incorporated in the metal hydride during the deposition of the film itself and not in a post deposition oxidation process.

In addition to the porosity and microstructure of the as-deposited films, the thickness is another factor that affects the extent of the oxidation process. As the incorporation of oxygen in the metal hydride is dependent on the availability of oxygen, the diffusion barrier involved in the transport of oxygen down into the film interior will cause a thicker film to overall be less oxidized compared with a thin film with similar porosity and microstructure.

Figure 2:
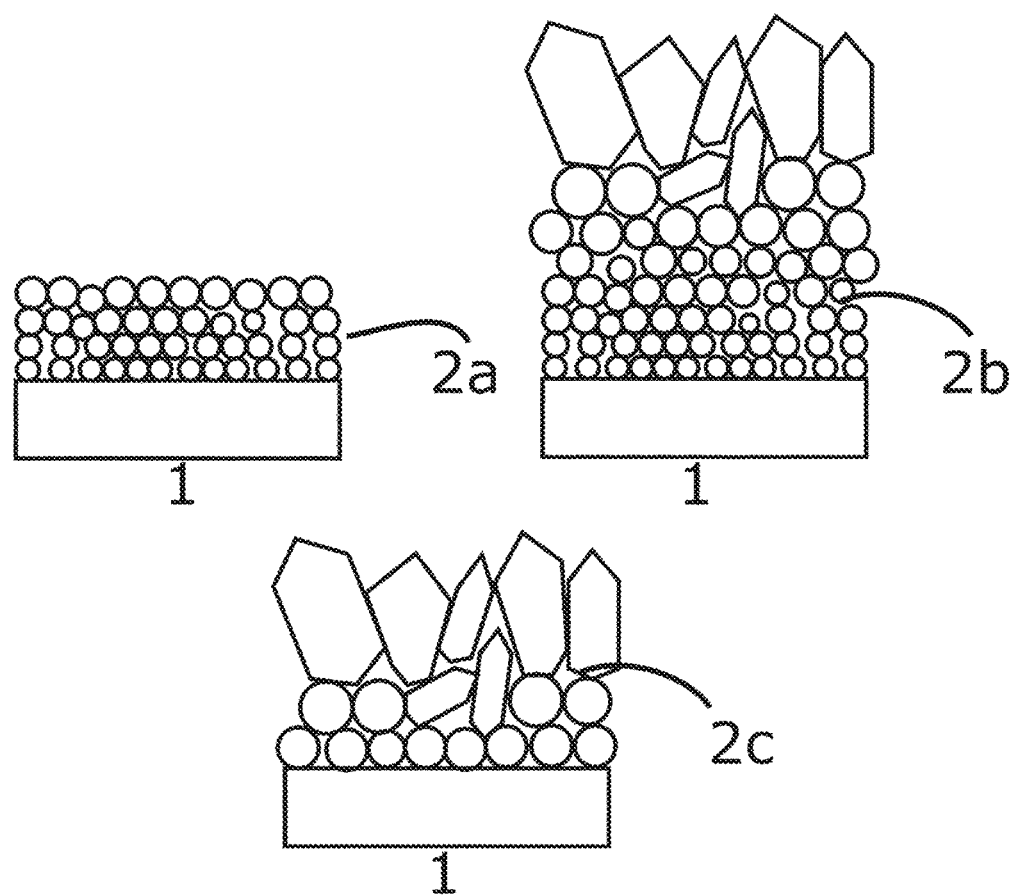
FIG. 2 illustrates different types of microstructures in the as-deposited metal hydride.

Moreover, the thickness, microstructure and porosity are not independent properties as illustrated in FIG. 2 where different thickness and structures of the metal hydride layer 2a, 2b, 2c is shown. A thicker film 2b often has a coarser microstructure than a thin film 2a, something that is largely caused by interface interactions between the deposited film and the substrate on which it is grown. Due to its high surface to bulk ratio, a thin film will be very strongly influenced by interactions with the substrate, an effect that will increasingly get weaker as the film grows thicker. Besides, thicker films grow in a columnar arrangement, which results in a coarse microstructure. In practice this means that a thicker film has the potential to incorporate a reduced amount of oxygen, both due to the formation of the diffusion barrier described above as well as due to its coarse microstructure.

The thickness of the as-deposited metal hydride is correlated with the composition of the final photochromic material, specifically to the Oxygen-to-metal atomic ratio (O/M), as observed by experimental analysis in the case where the metal is yttrium (Y):

As-deposited layer thickness~100 nm→O/Y≤1.5 (approximately)
As-deposited layer thickness~500 nm→O/Y≈1.3
As-deposited layer thickness~2500 nm→O/Y≈0.8

The thickness of the active photochromic layer must be adjusted in order to reach a compromise between optical transparency and optical modulation (the difference in transmittance between the clear and photodarkened state). A thick layer may increase the photochromic modulation caused by the incident light but will present a low optical transmissivity. On the other hand, a thin layer, usually less than 50 nm, will exhibit high transmittance but an insufficient photochromic modulation.

Thus the photochromic effect and contrast between maximum transmission and maximum absorption may be chosen as a function of thickness, porosity and microstructure. Often the oxygen exposure will be in the range of the natural occurrence in the environment so as to reduce the need for isolating and protecting the metal hydride.

In order to control the microstructure, a thin interface layer may be deposited on the growth substrate prior to the deposition of the metal hydride, so as to control the microstructure of the thin film during growth. The exact nature of the interface layer will depend on the choice of metal hydride as well as the choice of substrate, but typical examples of materials that can be used is titanium, chromium, aluminum, and silicon oxide, all having suitable surface properties. The interface layer can also be used as to improve adhesion between the metal hydride and the substrate, e.g. silicon oxide between a silicon substrate and yttrium hydride.

Figure 3:
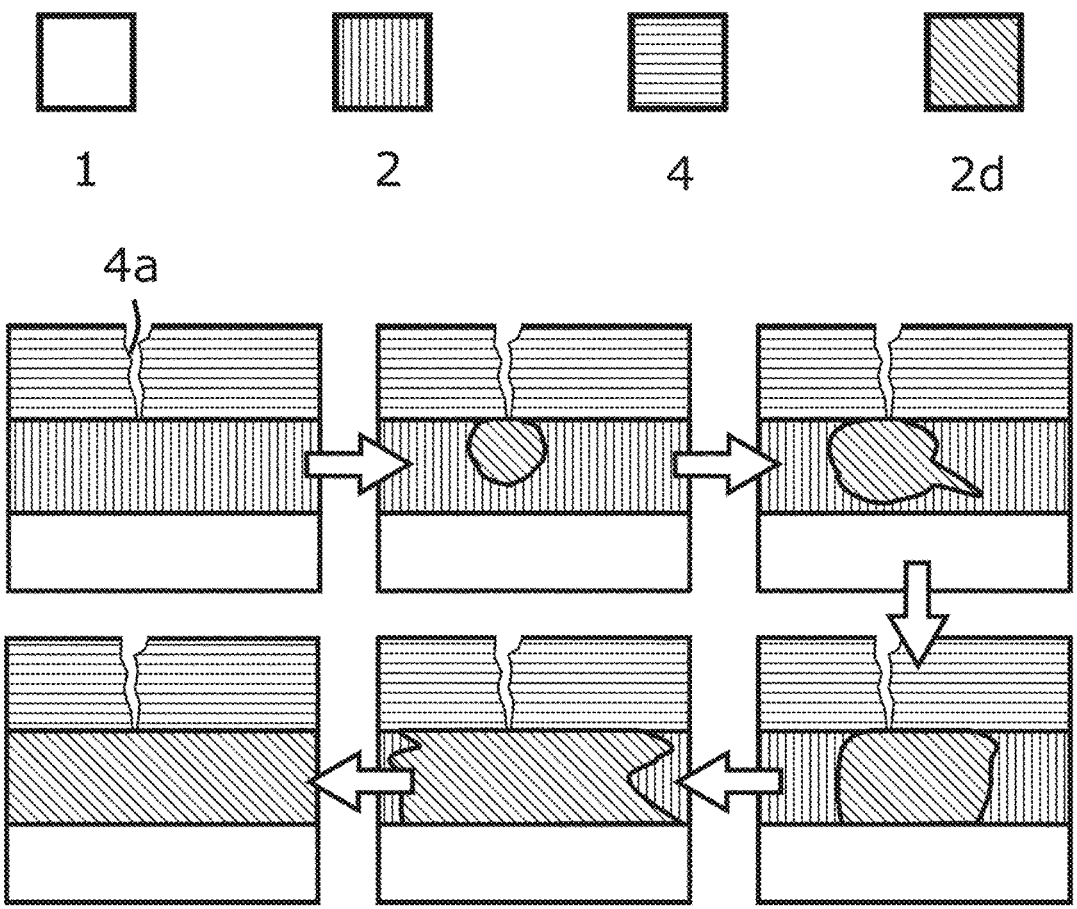
FIG. 3 illustrates the oxidation of the as-deposited metal hydride with an oxygen permeable capping layer.

As illustrated in FIG. 3, one way of controlling the availability of oxygen is to apply a capping layer of protecting material 4 on top of the metal hydride prior to treatment with oxygen. This layer can, in principle, be fully covering, completely blocking out the oxygen, or it can be designed to be partly covering, allowing oxygen only to penetrate on various locations 4a across the surface. By applying such a partly covering film, one imposes a limitation on the oxidation process as the oxygen now has to diffuse in a different network through the metal hydride. This allows for equilibrium in the oxidation process to be reached with less total oxidation having occurred compared with a metal hydride film with no capping. An example of an oxidation process occurring in a capped sample is illustrated in FIG. 3 from the upper left drawing following the arrows, showing how the oxygen 2d propagates in the metal hydride from a crack or similar 4a in the capping layer 4.

The reaction between the as-deposited metal hydride film and oxygen during a treatment with oxygen can also be controlled by adjusting the temperature and moisture level during this treatment. A higher temperature will result in a higher diffusivity of oxygen, causing an overall higher degree of oxidation, while increasing the moisture will have the same effect but then mainly because of the resulting increased availability of oxygen.

In addition to affecting the photochromic properties, the incorporation of oxygen has been reported to produce a band gap opening (Aleksandr Pishtshev et al.: "Role of oxygen in materials properties of yttrium hydride" in Solid state communications 194 (2014) 39-42) in the, otherwise, metallic metal hydride, making it transparent and with insulating properties. Moreover, the formation of wide-band gap metal oxide phases in the photochromic material can enhance the transparency of the combined material. Thus the method according to the invention in the preferred embodiment of the invention is the following two-step fabrication process for an oxygen-containing metal hydride. First, an essentially oxygen free metal hydride is deposited using a physical vapor deposition process. Secondly, a treatment with oxygen is performed where the oxygen reacts with the metal hydride, resulting in a material with photochromic properties. This treatment involves exposing the metal hydride to oxygen which results in the formation of an oxy-hydride, hydroxide, metal oxide or a mixture between these. The concentration of oxygen used to treat the metal hydride may vary but should be sufficient for obtaining the desired oxygen/metal (O/M) atomic ratio. The oxygen treatment results in a new overall structure in the material with increased photochromic properties compared with the initial metal hydride.

According to the preferred embodiment of the invention the as-deposited metal hydride is yttrium hydride.

According to one embodiment of the invention the as-deposited metal hydride is yttrium di-hydride ($YH_2$).

According to one embodiment of the invention, a capping layer is applied on top of the said metal hydride prior to the said oxygen treatment as a means of controlling the rate and/or nature of oxidation. The capping layer having structures allowing the oxygen to penetrate through it, at least in limited areas.

The as-deposited metal hydride has non-zero porosity, i.e. it is not densely packed but contains pores and cavities that provide a large effective surface area reacting with the oxygen to obtain or improve the photochromic effect. The porosity of the said metal hydride may be used to control the rate and/or degree of oxidation during the subsequent said treatment with oxygen.

A porous material can be defined as a material containing voids (pores) that cause discontinuities in the material. These voids can vary in size from macroscopic dimensions down to the sub nanometer scale and are in thin films generally a result of the fabrication process involving a phase transformation from a gaseous to a solid phase. As a direct consequence of a porous material containing voids, such a material will be less dense than a non-porous material of the same sort, while maintaining the same stoichiometry, crystal structure and lattice constant. A quantitative definition of porosity is given as the volume fraction of the total material volume occupied by voids, where for example a material consisting of 40% voids will have a porosity of 0.4 while a fully dense material will have a porosity of 0. According to the preferred embodiment of the invention when the as-deposited metal hydride is yttrium hydride, the porosity must be larger than 0, but will typically have a value of approximately 0.2.

According to one embodiment of the invention, the degree of oxidation of the said as-deposited metal hydride upon said treatment with oxygen is determined by the arrangement and size of grains, as well as agglomerates of grains. In the preferred embodiment of the invention where the metal hydride is yttrium hydride, the agglomerate size can be tuned between ~10 nm and ~1000 nm, with the individual grain size being limited on the upper side by the size of the agglomerates. A grain is here defined as a volume in the material where the crystal lattice is continuous, while an agglomerate is defined as a cluster of densely packed grains.

The fabrication process according to the method described above results in a component comprising a thin film on a substrate where the thin film is comprised of a mix between at least a metal oxide and either a metal oxy-hydride, or a metal hydroxide.

While the metal oxide, as well as the oxy-hydride or hydroxide, preferably is based on yttrium they may alternatively be based on a mix of several metals. Examples of such metals are, but not limited to, lanthanides and/or alkaline earth metals.

The invention claimed is:

1. A method for producing a transparent photochromic oxygen-containing yttrium hydride, the method comprising:
   forming, on a substrate, a layer of an essentially oxygen-free porous yttrium-di-hydride (YH2) with a predetermined thickness using a physical vapor deposition process, where the essentially oxygen-free porous yttrium-di-hydride comprises agglomerates of grains where the size of the agglomerates is between 10 and 1000 nm; and
   exposing the essentially oxygen-free porous yttrium-di-hydride layer to oxygen, where the oxygen reacts with the essentially oxygen-free porous yttrium-di-hydride, resulting in the transparent photochromic oxygen-containing yttrium hydride.

2. The method according to claim 1, wherein the essentially oxygen-free porous yttrium-di-hydride is doped with one or more elements from at least one of rare earth metals, lanthanides, and alkalis.

3. The method according to claim 1, wherein at least one oxygen-permeable capping layer is applied on top of the essentially oxygen-free porous yttrium-di-hydride prior to the exposing step.

4. The method according to claim 1, wherein the transparent photochromic oxygen-containing yttrium hydride comprises at least two of yttrium hydride, yttrium oxy-hydride, yttrium hydro-oxide, yttrium oxide, and yttrium.

5. The method according to claim 1, wherein the transparent photochromic oxygen-containing yttrium hydride is fabricated on a transparent substrate.

6. The method according to claim 5, comprising depositing a thin interface layer on the transparent substrate prior to the fabrication of the transparent photochromic oxygen-containing yttrium hydride.

7. The method according to claim 5, wherein the transparent substrate is a glass or polymer-based substrate.

8. The method according to claim 1, wherein the exposing step consists of exposing the essentially oxygen-free porous yttrium-di-hydride layer to an oxygen containing atmosphere.

9. The method according to claim 1, wherein the transparent photochromic oxygen-containing yttrium hydride has an oxygen/yttrium atomic ratio $O/Y < 1.5$.

* * * * *